United States Patent [19]

Legrady

[11] Patent Number: 5,154,621

[45] Date of Patent: Oct. 13, 1992

[54] PRINTED CIRCUIT BOARD CONTACT SYSTEM

[75] Inventor: Janos Legrady, Putnam Valley, N.Y.

[73] Assignee: Zierick Manufacturing Corporation, Mount Kisco, N.Y.

[21] Appl. No.: 737,266

[22] Filed: Jul. 29, 1991

[51] Int. Cl.⁵ .............................................. H01R 9/09
[52] U.S. Cl. ...................................... 439/82; 439/75
[58] Field of Search .................. 439/55, 75, 81, 82, 439/83, 751, 873, 45–48

[56] References Cited

U.S. PATENT DOCUMENTS

| | | | |
|---|---|---|---|
| 3,193,788 | 7/1965 | Brown | 439/46 |
| 3,400,358 | 9/1968 | Byrnes et al. | 439/75 |
| 3,792,412 | 2/1974 | Madden | 439/82 |
| 4,175,810 | 11/1979 | Holt et al. | 439/82 |
| 4,859,188 | 8/1989 | Neumann | 439/83 |
| 4,867,691 | 9/1989 | Eck | 439/82 |

*Primary Examiner*—Neil Abrams
*Attorney, Agent, or Firm*—Lackenbach Siegel Marzullo Aronson & Greenspan

[57] ABSTRACT

A printed circuit contact system for use in high speed digital applications includes a generally tapered slotted socket made of beryllium copper or other conductive spring material. The socket has a wave-like configuration which forms a series of outer contact portions which alternate with increasingly smaller inner contact portions. Insertion of an appropriately dimensioned pin through the socket causes engagement of the pin with at least one of the inner contact portions to radially expand the socket and force adjoining outer contact portions to abut against a sleeve lining a hole in a printed circuit board into which the socket is inserted. Expansion of the socket provides at least one portion thereof which is always under optimum load, assuring proper retention and physical and electrical contact over extended periods.

22 Claims, 5 Drawing Sheets

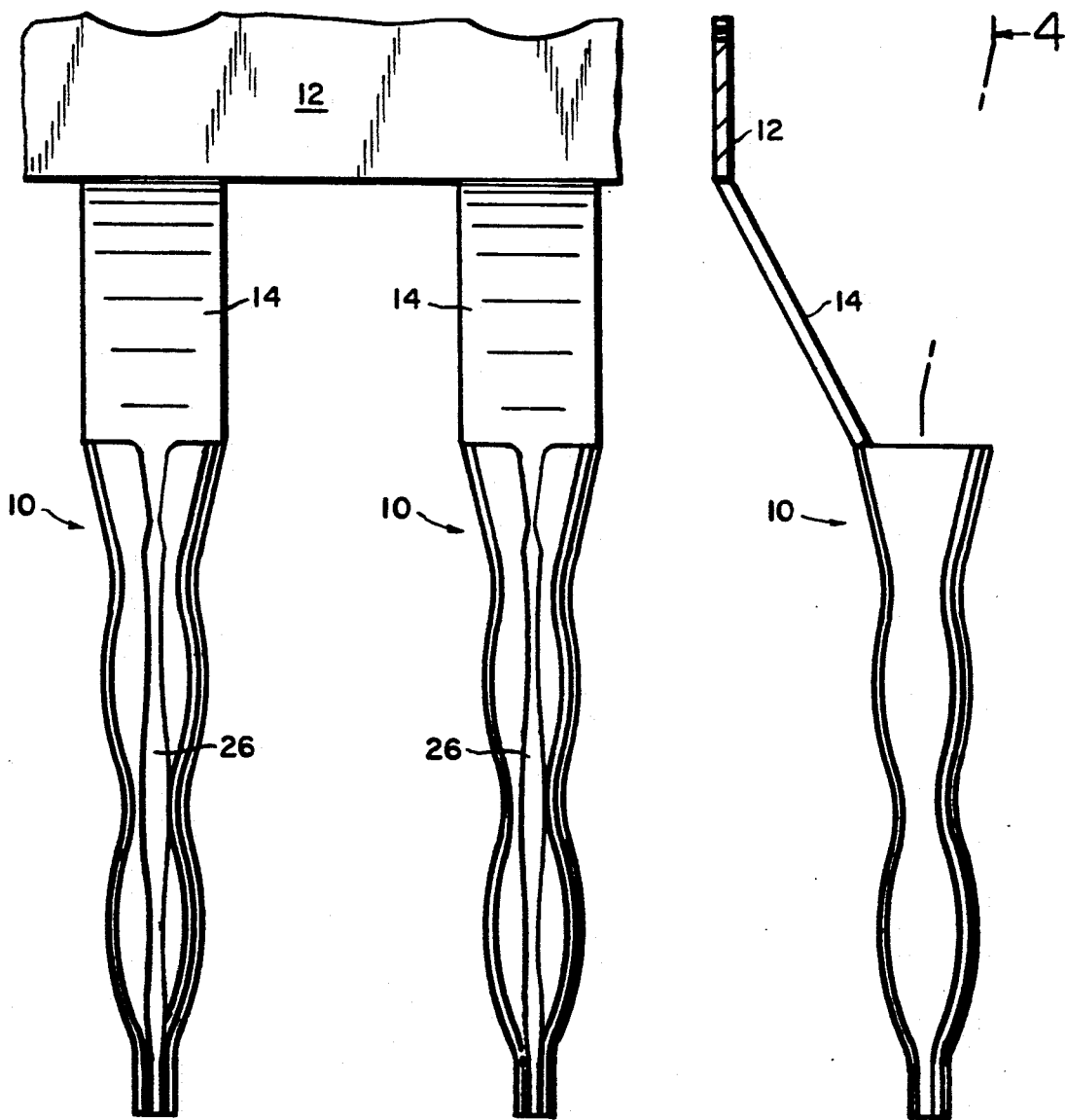
FIG.1
FIG.2
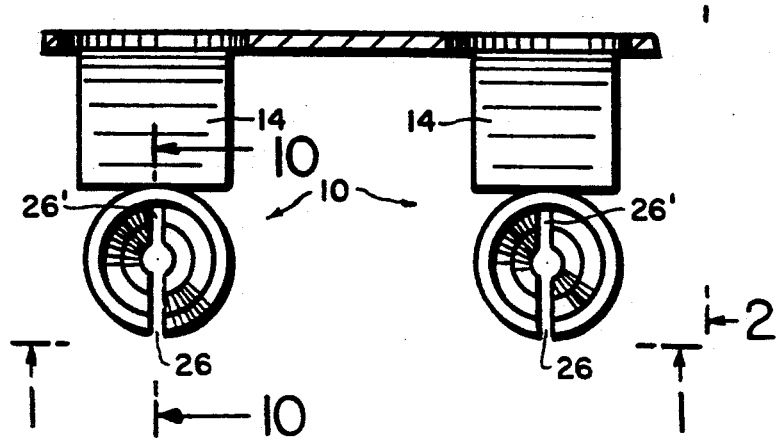
FIG.3

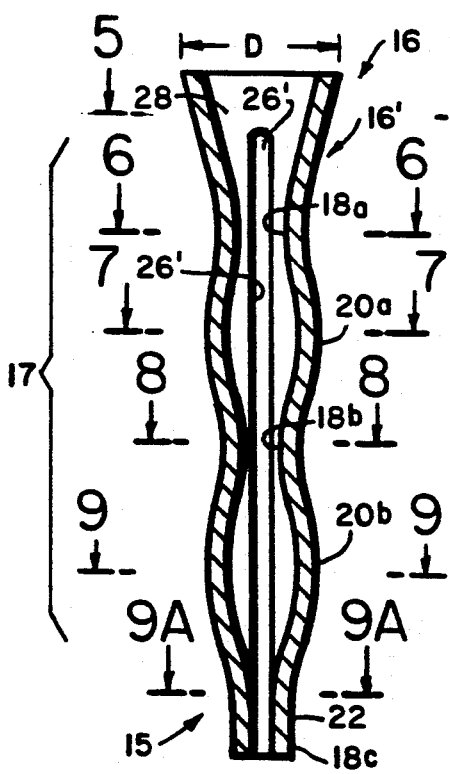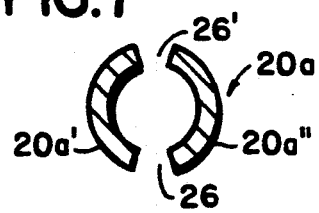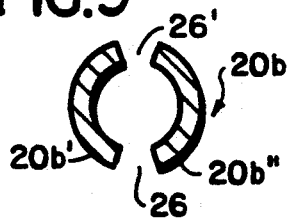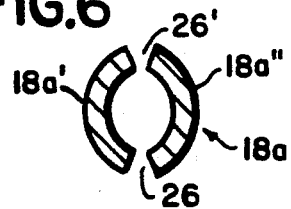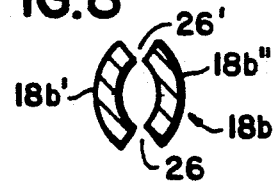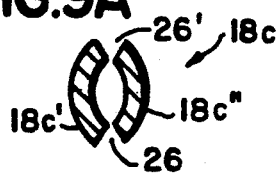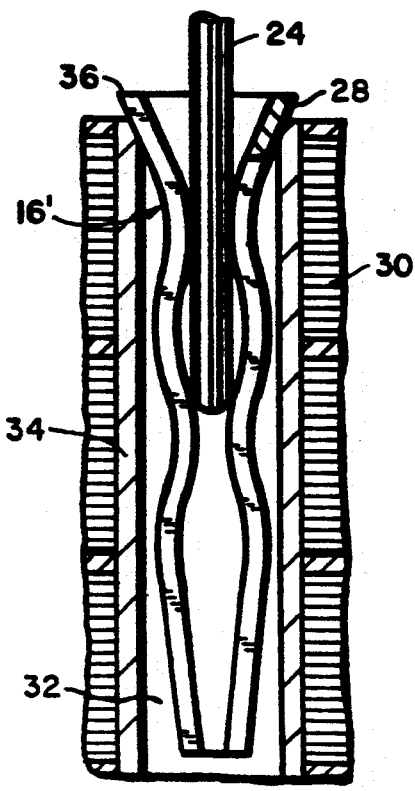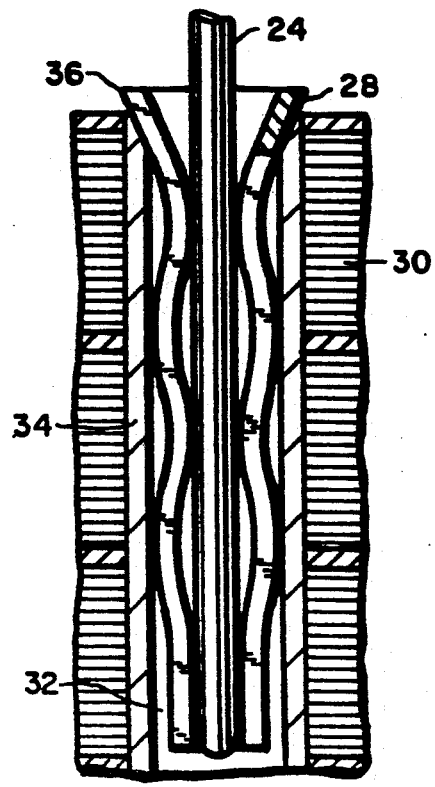

PRINTED CIRCUIT BOARD CONTACT SYSTEM

BACKGROUND OF THE INVENTION

1. Field of the Invention

This invention generally relates to electrical contacts and more specifically to a stacked printed circuit board connection system for making connections to printed conductors on single and multi-layered or stacked printed circuit boards used in high speed digital applications.

2. Description of the Prior Art

Typically, pins are mounted on printed circuit boards for interconnecting conductors on printed circuit boards with offboard circuits or components, such as by wire wrapping of conductors onto the pins. In some cases, such pins are used as test points. In other cases they provide electrical contact between printed circuits on stacked boards at different levels.

Numerous contact and interconnect arrangements have been proposed for mounting pins on printed circuit boards and for using conductive pins to interconnect printed conductors of stacked printed circuit boards or systems of modules of spaced printed circuit boards.

The objectives in the design of such contact arrangements include low assembly costs, good electrical contact (least resistance or maximum conductance) and ease and convenience of use.

In U.S. Pat. No. 2,283,040, pins are inserted into leaf springs of an electric plug device normally used in sockets. Spring receptacles, which expand upon the insertion of a pin, are also shown in U.S. Pat. Nos. 2,814,024 and 3,097,032. However, the considerations in designing electrical power receptacles or exteriorly-mounted sockets are significantly different than those for designing contacts to be received within plated through holes of stacked printed circuit boards. For one, the printed circuit board contacts of the type described herein are substantially smaller, are used in high density environments and frequently operate at much higher frequencies. Impedance matching, therefore, may become an important consideration in the printed circuit context while, of course, such is not a consideration in A.C. power circuits.

In U.S. Pat. No. 3,193,788, a connecting pin is disclosed which includes a plurality of resilient projections which abut against the internal surface of a cylindrical hole provided with conductive linings within the aligned holes or apertures in a multiple layered printed circuit board module. In U.S. Pat. No. 3,212,049, inwardly directed contacts form a tapered receptacle which makes contact with a pin. However, the tapered contacts do not significantly change their configuration upon insertion or removal of a pin, and do not change the degree of contact between the receptacle and the inner conductive surface of the individual printed circuit holes. The same is true of the socket assembly described in U.S. Pat. No. 3,218,606.

In U.S. Pat. No. 3,400,358, multiple bow contacts are uniformly spaced from each other, each of the bows having substantially the same external dimensions to form an elongate single plug that can pass through a series of aligned holes in different printed circuit boards. No pins are used to expand the plug. Each bow is arranged to make contact with another printed circuit board contact.

A board-to-board interconnect device is disclosed in U.S. Pat. No. 4,859,188 which uses slotted discs 24 to make contact with a wire 30 bridging the boards.

However, the prior art contacts tend to be bulky and are not suitable for use with high speed digital printed circuit boards which have holes, the interior surfaces of which are plated with thin layer conductors to which positive electrical contact must be made to maintain desired impedance levels and minimize losses. Also, the prior contacts do not offer the required performance packaging advantages for use on memory boards, computer hardware equipment and similar requirements where effective and economical use of available printed circuit board space is needed.

In U.S. Pat. No. 3,792,412 a printed wiring board terminal assembly is shown in which a square pin cooperates with an adapter sleeve which defines a plurality of longitudinal contacting nodes. Insertion of the pin causes the contacting nodes to expand radially to make electrical contact with the plated surface of a hole in a printed circuit board. However, because the contacting nodes are longitudinal, wiping action of the hole plated surface is incomplete and, therefore, conductivity may be impaired.

SUMMARY OF THE INVENTION

Accordingly, it is an object of the present invention to provide a printed circuit board contact and interconnection system which does not have the disadvantages of prior art or known systems or devices.

It is another object of the present invention to provide a printed circuit board contact system which is simple in construction and economical to manufacture.

It is still another object of the present invention to provide a printed circuit board contact system which utilizes a series of integrally formed spring sockets having a tapered progressive wave-like spring design.

It is yet another object of the present invention to provide a contact system as aforementioned which offers exceptional performance and packaging advantages.

It is a further object of the present invention to provide a contact system as in the previous objects which makes economical use of available printed circuit board space to meet increased printed circuit board density demands.

It is still a further object of the present invention to provide a printed circuit board contact system which is simple to use, and can be utilized with automatic insertion equipment.

It is yet a further object of the present invention to provide a contact system as described in the previous objects which can be used with single printed circuit boards as well as multiple, stacked and modular printed circuit board arrangements.

It is an additional object of the invention to provide a contact system for printed circuit boards of the type under discussion which can be used with holes whose tolerances are substantially less critical than with known contact systems.

It is still an additional object of the invention to provide a contact system as in the previous objects which, in use, includes at least a portion thereof which is always under optimum load regardless of the hole size, thereby assuring proper retention and physical and electrical contact over extended periods of use.

It is yet an additional object of the invention to provide a contact system as in the last two objects which preserves, over extended periods of use, the integrity of the conductive sleeves which are provided within the holes of the printed circuit boards with which the contact system is used.

In order to achieve the above objects, as well as others which will become apparent hereafter, a printed circuit board contact system for providing contact with a conductive sleeve provided on an inner surface of a hole of predetermined substantially uniform cross-sectional dimensions in a printed circuit board comprises a socket the wall of which is made of a conductive spring sheet material and which defines a longitudinal axis. Said socket has a broad inlet end and a narrow outlet end which are spaced from each other along said longitudinal axis. Said narrow outlet end is dimensioned and configurated in relation to said predetermined dimensions to facilitate insertion thereof into a hole of the printed circuit board and said broad inlet end is dimensioned and configurated in relation to said predetermined dimensions to prevent free passage thereof when said socket is inserted into the hole. A conductive pin is provided which is dimensioned and configurated to be initially receivable with clearance within said broad inlet end, said socket being provided with at least one substantially longitudinal slot generally parallel to said longitudinal axis extending along the length direction of said socket to enable radial expansion of said socket to conform to the outer surface of said pin when said pin is urged through successive portions of said socket along said longitudinal axis in the direction of said narrow end. Axially spaced enlarged regions are provided forming outer contact portions which alternate with inner contact portions which define decreasing cross-sectional areas in the direction from said broad to said narrow ends. Said socket and pin are dimensioned and configurated to cause said socket to expand when said pin is forced through successively smaller dimensioned areas defined by said inner contact portions to cause proximate outer contact portions to abut against and make electrical contact with the printed circuit conductor sleeve.

In a presently preferred embodiment, the socket is generally tapered and dimensioned so as to provide an interference fit when said socket is inserted into the hole of the printed circuit board.

BRIEF DESCRIPTION OF THE DRAWINGS

The novel features which are believed to be characteristic of this invention are set forth with particularity in the appended claims. The invention itself, however, both as to its organization and method of operation, together with further objects and advantages thereof, may best be understood by reference to the following description taken in connection with the accompanying drawings, in which:

FIG. 1 is a front elevational view of two spring sockets of a printed circuit board contact system in accordance with the present invention, mounted on a carrier by means of connecting tabs, in a form suitable for insertion into printed circuit boards by automated equipment;

FIG. 2 is a side elevation of one of the carrier-mounted sockets shown in FIG. 1;

FIG. 3 is a top plan view of the carrier-mounted sockets shown in FIG. 1;

FIG. 4 is a cross-sectional view of the spring socket shown in FIG. 2, taken along line 4—4.

FIG. 5 is a cross-sectional view of the socket shown in FIG. 4, taken along line 5—5;

FIG. 6 is a cross-sectional view of the socket shown in FIG. 4, taken along line 6—6;

FIG. 7 is a cross-sectional view of the socket shown in FIG. 4, taken along line 7—7;

FIG. 8 is a cross-sectional view of the socket shown in FIG. 4, taken along line 8—8;

FIG. 9 is a cross-sectional view of the socket shown in FIG. 4, taken along line 9—9;

FIG. 9' is a cross-sectional view of the socket shown in FIG. 4, taken along line 9'—9';

FIG. 10 is a longitudinal cross-sectional view of the socket shown in FIG. 3 taken along line 10—10, showing the socket inserted within a hole of a high density stack of printed circuit boards, and a pin partially inserted through the funnel shaped portion or broad-shaped inlet end of the socket;

FIG. 11 is similar to FIG. 10, but showing the pin fully inserted through the length of the socket to expand portions of the socket to establish contact between the socket and the plated conductive sleeve lining the hole of the stacked printed circuit boards;

DESCRIPTION OF THE PREFERRED EMBODIMENTS

Figure 12:
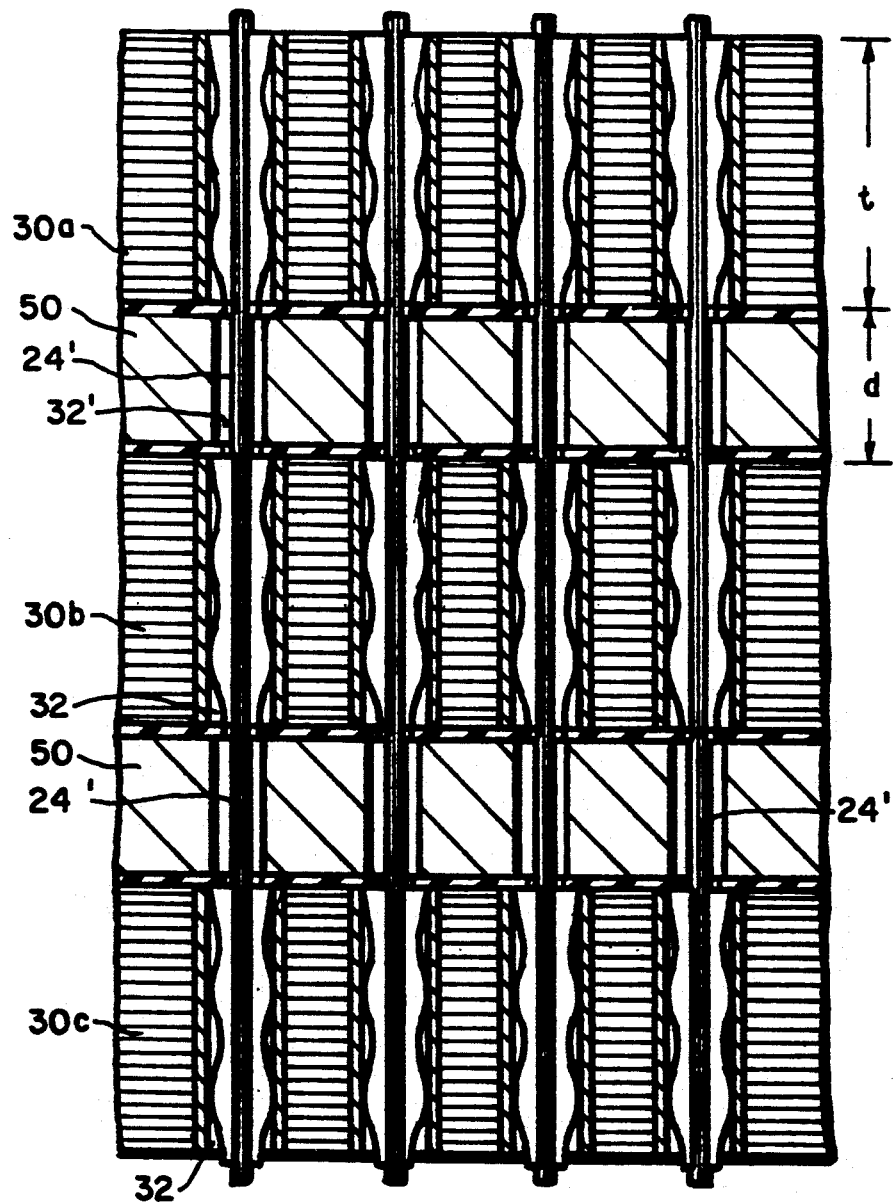
FIG. 12 is a side elevational view, in cross-section, of three stacks of printed circuit boards spaced from each other and having their holes aligned so as to interconnect conductors on the boards with each other by means of the pins extending through and bridging the stacks of the printed circuit boards.

Referring now specifically to the drawings, wherein the identical or similar parts have been designated by the same reference numerals throughout, and referring first to FIGS. 1-3, the printed circuit (PC) board contact system in accordance with the present invention, includes, as one component thereof, a generally tapered or conical female spring contact having an undulated configuration and designated by the reference numeral 10. The socket 10 has a multi-wave or progressive wave configuration, as to be more fully described. Advantageously, the sockets 10 are initially connected to a continuous carrier strip 12 by means of connecting tabs 14, as shown. The carrier strip 12 detachably supports or carries a plurality of sockets 10 to facilitate handling and insertion of the sockets, by known means, into a printed circuit board by automated means. When so used, the sockets 10 are substantially equally spaced from each other along the carrier strip 12, a typical spacing being 0.1 inch.

While the material from which the sockets 10 are produced is not critical, it should be a conductive sheet spring material. It has been found that beryllium copper is suitable for this purpose. The sockets 10, as will become evident, have primary application in connection with single or stacked printed circuit boards. It will be appreciated, therefore, that the overall dimensions that the sockets 10 can be relatively small since they may be inserted into 0.02 inch diameter holes formed in the printed circuit boards. When beryllium copper is used, it has been determined that a thickness of approximately 0.0035 inch thick sheet material is suitable. In order to provide the desired resilient properties of the socket, the beryllium copper sheet material should be tempered, and preferably fully hard tempered. Additionally, in order to enhance conductivity and minimize resistivity, the sockets 10 are advantageously gold plated. It has been found, for example, that plating the sockets with 0.000030 inches minimum of gold over 0.000010 to 0.000050 inches of copper provides desirable conductive properties. While the aforementioned parameters describe a presently preferred embodiment of the sockets 10, these dimensions are not critical and the dimensions may be altered to accommodate different printed circuit board configurations, providing different degrees of advantage in different operating environments.

Referring to FIG. 4, a single socket 10 is shown in section cut by a plane passing through its longitudinal axis defined by the length direction of the socket 10. The socket 10 has a narrow outlet end 15, an opposing broad inlet end 16, and an intermediate body portion 17. The narrow end 15 and the intermediate body portion 17 are dimensioned and configurated in relation to a hole in the PC board to facilitate insertion thereof into the hole with some clearance, as shown in FIG. 10.

Advantageously, the broad end 16 is in the shape of an outwardly flared inlet or funnel shaped portion, which facilitates insertion of a pin, as shown in FIG. 10, and also facilitates complient press fit socket retention in the PC board hole, as will be more fully described in connection with FIGS. 9, 10 and 13-17. However, the specific shape of the broad inlet end is not critical, as long as it facilitates initial insertion of the pin and has a shape and size which engages the printed circuit board to anchor it and prevents undesired axial movements of the socket when the socket is fully inserted into the hole.

The narrow outlet end 15 and intermediate body portion 17 of the socket 10 are formed, along the direction from the broad end 16 to the narrow end 15, with increasingly smaller cross-sectionally dimensioned inner contact portions 18a, 18b and 18c and substantially equally dimensioned, outer contact portions 20a, 20b which alternate with and spaced between associated inner contact portions. In the embodiment being described, as is typically the case, the holes in the printed circuit boards are circular and the socket 10 is generally circular in cross-section. The socket 10 has an undulating configuration to provide a wave-like shape along the direction of the longitudinal axis to define such inner and outer contact portions which successively or alternately form substantially circular and oval cross sections in planes normal to the longitudinal axis. This is illustrated in FIGS. 5-9'. In the presently preferred embodiment, three inner contact portions 18a, 18b and 18c alternate with two outer contact portions 20a, 20b. However, it should be evident that the total number of contact portions or the number of such contact portions per unit length is not critical, and the number may be increased or decreased depending, for example, on the length of the hole in the PC board, the number of boards in a stack, and the degree of contact desired.

In one presently preferred embodiment designed for high density stacked multi-layered PCBs, for example, the opening defined by the inlet funnel portion 16 is approximately 0.0270 inches in diameter. The total height or length of the socket 10 along its longitudinal direction is 0.1310 inches, while the axial length of the outlet contact portion 22 is 0.01 inch. As best shown in FIGS. 5-9', the socket is formed of a number of contact portions 18a, 18b, 18c, 20a, 20b and 22, each of which is formed of two associated or cooperating opposing sections. While the contours defined by the socket at different axial points along its length may define different areas, each of the sections from which they are formed have substantially constant radii of curvature throughout all cross-sections. This radius of curvature is slightly larger to the radial dimension of a mating pin 24 (FIG. 10). At the wide cross-sections the centers of the two half sections 20a', 20a" and 20b', 20b", respectively, of the contact spring or outer contact portions 20a, 20b substantially coincide on a common center point to lie on or be coextensive with a common circle. Such circle is separated into two halves by slits or gaps 26, 26'. Each of the cooperating sections 20a', 20a" and 20b', 20b" includes an angle of approximately 144°. The wide portions 20a, 20b advantageously form clearances and do not initially abut against and make physical and electrical contact with the conductive sleeve or lining 34 of the plated through hole 32. The sections forming the decreasingly smaller inner contact portions 18a, 18b, 18c also have the same radius of curvature as the wider outer contact portions, but the centers of each of the two half sections forming each of the inner contact portions are offset in the direction of the associated opposing section so that the two half inner contact springs or sections are closer to each other. The aforementioned sections define arcs including smaller angles (e.g. sections of portion 18a are approximately 125°, the sections of the portion 18b define approximately 102°, and the sections of portion 18c define approximately 100°). Prior to expansion by insertion of the pin 24, each pair of associated sections generally forms an oval shape, like that of a football. Once the pin 24 is inserted into the inner contact portions 18a, 18b and 18c, the respective sections of the engaged inner contact portions separate to closely engage the outer cylindrical surface of the pin and assume spacings similar to those of the sections of the outer contact portions 20a, 20b. In the embodiment being described, the centers for the respective sections forming the inner contact portion 18a may be displaced or offset by approximately 0.004 inches, the spacing of the centers of the respective sections forming the inner contact portion 18b may be offset approximately 0.008 inches and the corresponding spacing of the centers for the sections forming the outlet contact portion 22 may be offset approximately 0.011 inches. The inner diameters of each of the outer contact portions is approximately 0.02 inches. The axial distance between an inner contact portion 18a, 18b and an adjoining or next successive outer contact portion 20a, 20b, is approximately 0.02 inches, so that the period of the wave extending from either one outer contact portion to a next successive outer contact portion or from an inner contact portion to a next successive inner portion, is approximately 0.04 inches. Again, these dimensions are given for purposes of illustration only and are not intended to be critical for purposes of the invention. The dimensions can be modified to accommodate given materials and uses, with different degrees of advantage.

Referring to FIGS. 10 and 11, a portion of a printed circuit board 30 is shown in which a cylindrical hole 32 has been formed and lined with a conductive sleeve 34, such as by copper plating of the hole to provide a conductive sleeve or lining. Copper plating of holes is more commonly used in systems of printed circuit boards, such as stacked multi-layered boards or modular systems in order to facilitate interconnection of printed conductors on different boards to each other. As will become evident to one skilled in the art, the contact system of the present invention can be utilized both with single printed circuit boards as well as with different configurations of a plurality of stacked printed circuit boards. One of the problems associated with providing conductive surfaces on the insides of the holes 32 is that the process is costly and time consuming. Additionally, because the holes are generally small in diameter, the thickness of the conductive sleeve 34 is frequently extremely thin and it is important that any suitable contact system used for this purpose must make good physical and electrical contact with the conductive sleeve 34 without scratching or otherwise damaging the conductive sleeve 34. Ideally, it is desired to maximize electrical contact with the conductive sleeve 34. This requires that the conductive sleeve 34 be clean and not be scratched or otherwise damaged. If the conductive sleeve on the plated through hole 32 is deformed or damaged, the connection between the inner layer of the PC board and the wall of the plated through hole is weakened or separated, possibly resulting in intermittent contacts. This problem is more fully discussed in connection with FIGS. 13-17.

As above noted, the narrow end 15 of the socket 10 is dimensioned and configurated to facilitate insertion into the hole 32 of the printed circuit board 30. In the presently preferred embodiment, the socket 10 is generally tapered as shown and all of the external dimensions of the socket 10 are smaller than the internal dimensions of the hole 32 so that the entire socket can be freely inserted, with clearance, into the hole 32, with the exception of the extreme upper or broad inlet end 16 of the socket forming the enlarged open end of the funnel which engages the upper edge or surface of the PC board, as shown in FIGS. 10 and 11. The wave socket 10 is held in place in the hole 32 by the compliant press or interference fit of that portion 16' of the funnel section 16 whose diameter exceeds that of the hole 32. The cone shaped funnel 16 has a unique self-adjusting feature which practically eliminates the deformation of the PC board hole across a large range of hole diameters even when the terminals are inserted flush with the PC board surface. While the preferred embodiment is generally tapered and provides a press fit when inserted into the hole, it is also possible to eliminate the taper along the outside surface of the socket and use a lip or rim or other stop member at the upper tee edge of the socket to longitudinally locate or fix the socket at the desired position and prevent passage through the hole.

Figure 13:
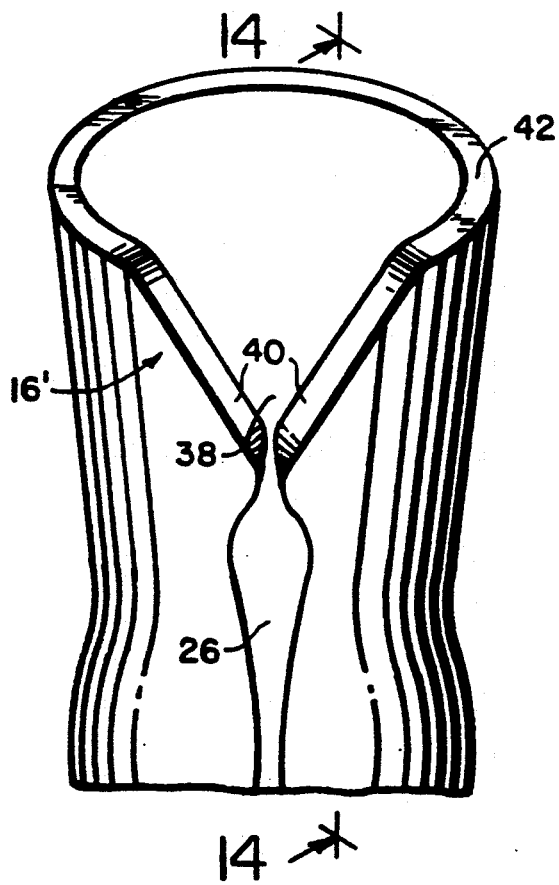
FIG. 13 is a perspective view of the upper portion of a spring socket in accordance with the invention, showing the details of the upper funnel shaped portion which serves both as an outwardly flared pin inlet and trailing end of the spring socket which engages the printed circuit board to anchor it and prevent undesired axial movements of the socket.
Figure 14:
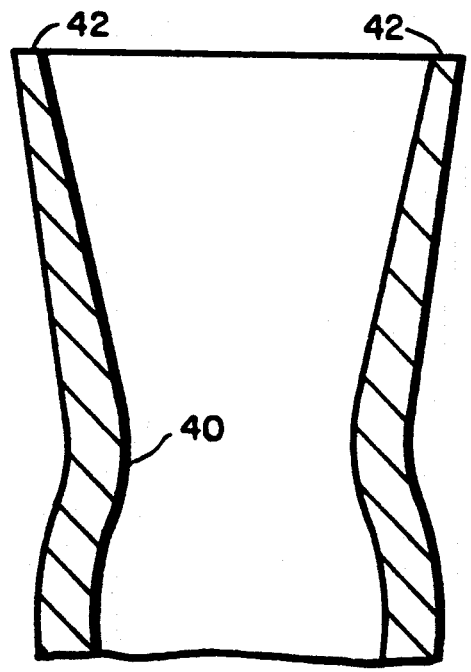
FIG. 14 is a cross-sectional view of the conical end of the spring socket shown in FIG. 13, taken along line 14—14.
Figure 15:
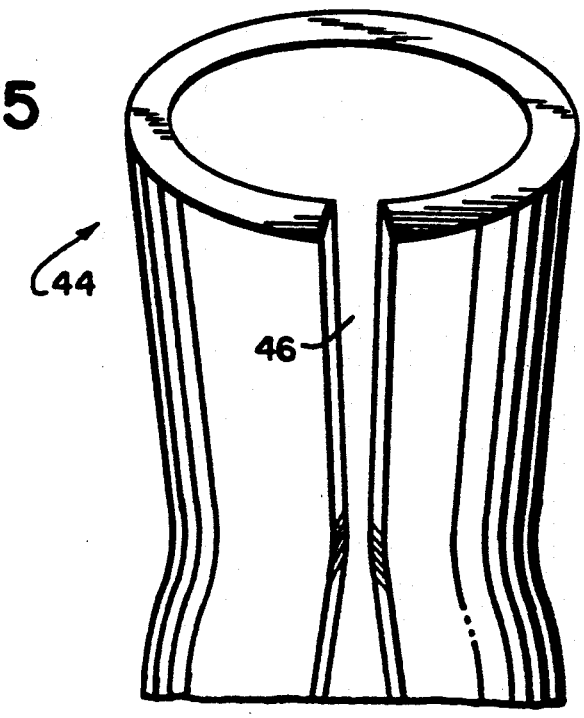
FIG. 15 is similar to FIG. 13, but showing, for comparison purposes, a funnel of uniform material thickness and with a substantially uniform constant width gap.
Figure 16:
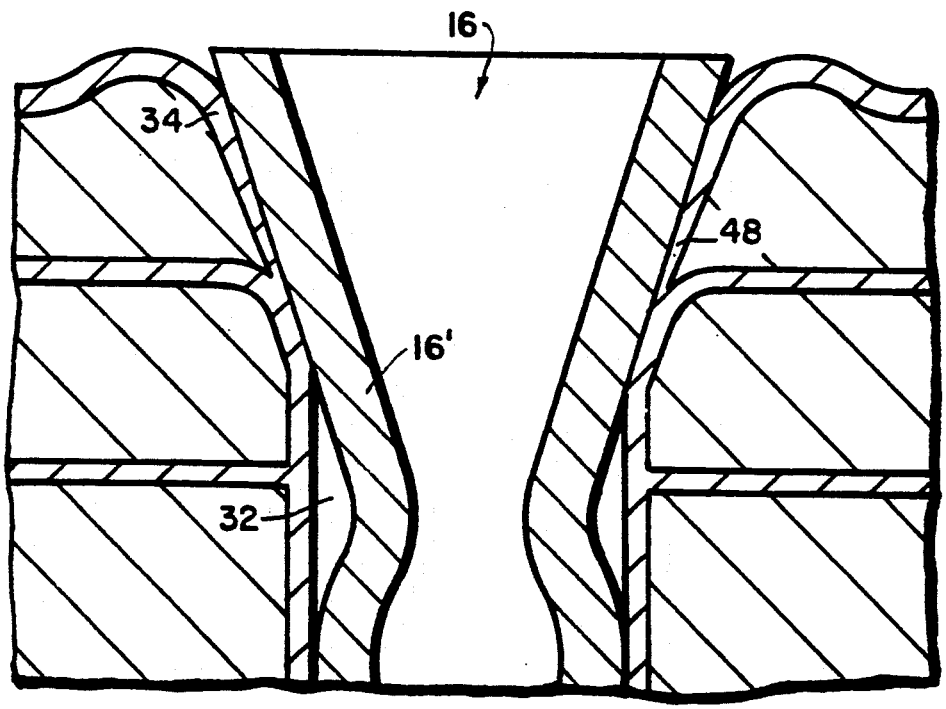
FIG. 16 illustrates the disadvantages in using a funnel of the type shown in FIG. 15 within a plated through hole in a stacked multi-layer printed circuit board, and the possible areas of damage that may result when the spring socket is forced into the hole.
Figure 17:
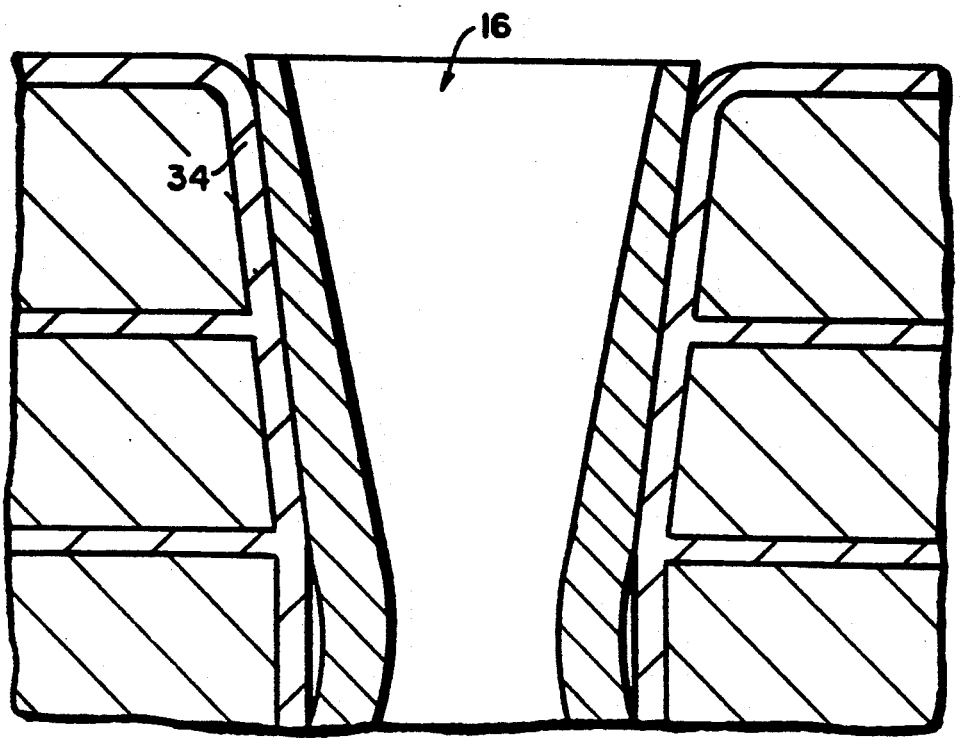
FIG. 17 is similar to FIG. 16, but showing the improved results obtained when the spring socket including a funnel of the type shown in FIGS. 13 and 14 is inserted into a plated through hole.

The broad end 16 has a cone shape with a front longitudinal slit or gap 38 on one side (FIGS. 11, 3, 13) which is a continuation of the slit or gap 26. The larger diameter of the cone is selected to be about 15% greater than the largest anticipated hole diameter and the smaller diameter (at the point where joined to the inner contact portion 18a) is smaller than the smallest anticipated hole diameter. The gap 38 in the funnel shaped portion 16 is "v"-shaped (as shown) and ranges from a small width (0.001-0.002) at the small end of the funnel and increases to 0.007-0.010 at the large end of the funnel. The material thickness of the funnel also varies. It is thicker at the small diameter (at 40) and thinner at the large diameter (42), as shown in FIGS. 13 and 14. The best way to explain how this self-adjusting compliant press fit funnel works is to compare it to a funnel 44 of uniform material thickness with a uniform constant width gap 46 as shown on FIG. 15. When the latter funnel 44 is forced into a PC board plated through hole, first the gap will close as the material edges abut against each other. At this point, the funnel 44 becomes very stiff. When it is pressed further into the hole, the stiff funnel will deform the wall of the hole (FIG. 16 at 48) to the funnel's shape. In this process the thin wall of the plated through hole is likely to be damaged. The plating may stretch and crack. Also the inner layers of a multilayer PC board, which are connected to the wall of the hole may break off. The tapered shape also provides very poor terminal retention in the hole because it is very easy to pull it back (out) from the hole.

When the self-adjusting funnel is pressed into a plated through hole (FIG. 17), first the small gap at the bottom of the "Y" will close and the structure stiffens a little. However, there is no significant increase in the stiffness of the funnel because as the funnel is pushed deeper and deeper into the hole, the forces act on an increasingly larger diameter but thinner and thinner material thickness. This will result in minimum hole deformation and increased deformation of the funnel. The funnel angle will decrease, which improves the terminal retention in the hole. Also with this design a much larger funnel area can make direct contact with the wall of the plated through hole, without damaging the wall. This further improves terminal retention. The conductive pin 24, shown in the preferred embodiment to have a uniform circular cross-section, typically has a length greater than the thickness of the printed circuit board 30 and is dimensioned and configurated to be received within the printed circuit hole. The broad inlet end 16 of the socket is dimensioned to facilitate insertion of the conductive pin, the inlet portion 16 initially guiding the pin and centering it along the longitudinal axis of the socket.

An important feature of the invention is that the socket 10 and the pin 24 are dimensioned and configurated to cause the socket 10 to expand when the pin 24 is forced through successively smaller dimensioned areas defined by the inner contact portions 18a, 18b, 18c to cause associated outer contact portions 20a, 20b to expand and abut against and make electrical contact with the printed circuit board conductor 34. In order to permit such expansion, the socket 10 is provided with at least one front longitudinal slot 26, which opens at the narrow end 15 to enable radial expansion of the narrow end. As shown in FIGS. 1 and 3, the slot 26 extends along the entire length of the socket 10. The presently preferred embodiment, however, includes two slots 26, 26' on diametrically opposite sides of the longitudinal axis. The slot or groove 26' does not extend the entire length of the socket 10 in order to leave a connecting portion 28 which maintains the two half sections of the socket formed by the diametrically opposite slots or grooves connected to each other.

One socket can accommodate a large range of hole diameters. The present configuration is designed for holes from 0.020" to 0.026" diameters, which is 30% tolerance on hole diameter. There are no other terminals of this type which permit such large hole diameter tolerances. In one extreme case the socket is inserted into a small diameter hole (low end of the hole tolerance) it fits loosely in the hole. The outer contact points 20a, 20b may or may not touch the wall of the plated through hole. However, even if the outer contact points touch, there is no force or pressure between the surfaces. The mating pin 24 diameter is larger than the opening defined by the initial inner contact portion 18a. When the pin is pushed through the inner contact 18a, it will displace and separate both halves or sections of the contacts. Outer contact portions 20a, 20b are forced against the conductor 34 of the plated through hole 32 under pressure. The deformation of the socket at and near the contact portions 18a, 20a is within the elastic limit of the material (so there is no permanent set). However, the expansion of the socket provides sufficient pressure at the inner and outer contact areas to establish a good physical and electrical contact between the pin 24 and the socket and between the socket and the wall of the plated through hole. Inner contact section 18b is smaller than 18a. As the mating pin 24 is pushed through the socket's cross-section at 18b, it will deform this area because the outer contact portions 20a, 20b already abut against the wall of the plated through hole and there is no more space within which the socket can further open up. When the socket is inserted into a small diameter hole the deformation of the inner contact portion 18b is permanent (over the elastic limit of the socket's material). The force required to permanently deform the socket is smaller than a force which would damage the wall of the hole. This permanently deformed section also acts as a protective sleeve, protecting the wall of the hole from damage and wear when the pin is re-inserted. As the mating pin 24 is pushed further into the socket, it passes through the third inner contact portion 18c. Now, the diameter difference between the pin and the socket cross-section is larger than it is at the cross-section 18b. Therefore, when the socket is inserted into the smallest diameter hole and mated with a pin 24 the first contact portion 18a will act as a spring, deforming within the elastic limit and providing the necessary interconnection force and pressure needed for a good connection. Because there is no permanent deformation in this cross section, it can be mated and unmated hundreds of times with a minimum stress relaxation. The other two inner contact areas 18b, 18c will take a permanent set. Therefore, those areas do not provide a long lasting reliable connection. However, one good long lasting connection provided at cross-section 18a, for example, is usually sufficient. By changing the frequency, amplitudes and taper of the wave configuration two or more inner contact portions can be maintained within their elastic limit.

The other extreme is when the socket is inserted into the largest diameter plated throughhole (high end of the hole tolerance). In this case, the outer contact portions 20a, 20b can move more outward before pressing against the wall of the hole. Therefore, the mating pin 24 passes through portions 18a and 18b without deforming those areas and without generating significant forces or pressure. As the mating pin 24 passes through the third inner contact portion 18c, the pin displaces and deforms this area of the socket spring, pushing the outer contact portion 20b against the wall of the hole providing contact force and pressure both of the inner portion 18c and the outer portion 20b. The deformation of this socket section is within the elastic limit of the socket material, which provides good spring characteristics for repeated matings. The wave constructions effectively provide three sets of connected, but independent contact springs. With three springs a large range of hole diameters can be covered. One out of three springs will be under optimum load and deflection when the mating pin 24 is inserted within a large range of the hole diameters. The other two springs may not make contact or may take a permanent set or a combination of the above, depending on the hole diameter.

In FIG. 12, three spaced printed circuit boards 30a, 30b, 30c are shown, spaced or separated from each other by spacer plates 50 having a thickness "d". The holes 32 in the respective printed circuit boards are aligned with each other so as to permit passage of the pins 24' through the printed circuit boards, the pins 24' having a length selected in accordance with the specific application. If it is only intended to electrically interconnect the boards to each other, the lengths of the pins 24' may be substantially equal to the sum of the thicknesses "t" the printed circuit boards and the distances representing the spacers 50 between the boards. However, if the pins are to remain accessible, exteriorally of the boards, for purposes of soldering, connecting to other sockets or for use as a test point, the pins must be appropriately lengthened.

The spacer plates 50 are made of conductive material, which is grounded to provide shielding between the signal lines to prevent crosstalk. The diameters 32' of the holes in the plates 50 are larger than the pin 24' diameter so the pin does not make contact with the wall of the plates or spacer blocks. The capacity between the pin 24' and the ground is determined by the hole diameter 32' and the dielectric in the hole, which can be air (as shown in FIG. 12) or the hole can be filled with another non-conductive dielectric material. By changing the variables (hole diameter, spacing, dielectric) the characteristic impedance of the connection system can be matched with the rest of the system's characteristic impedance. The hole 32' in the spacer block 50 also has a mechanical function, namely, it guides the pin and limits its buckling when the pin is pushed from the upper PC board 30a to and into the socket on the lower PC board 30c. In use, the sockets 10 are inserted into one or more aligned holes 32, and a pin 24' is inserted to expand the sockets to provide physical and electrical contact with the conductive layers or linings within the holes of each of the printed circuit board stacks 30a, 30b, 30c.

The small sizes of the inter connect pins 24' (0.012" diameter) and the socket 10 (e.g. goes into a 0.020" diameter hole) makes it possible to build a very high density system. With the dimensions above mentioneed, the configuration permits spaced holes on 0.050" centers providing 400 signal lines per square inch.

The matched controlled characteristic impedance, with a very low inductance and capacitance, and the high density of this inter connection system, is ideal for super high speed digital applications.

It should be evident that the printed circuit board contact system in accordance with the present invention, which utilizes the progressive wave spring design, is highly suitable for miniature interconnection of printed circuit boards, and offers exceptional performance and packaging advantages for stacked circuit board modules, computer hardware equipment and similar requirements where effective and economical use of available printed circuit boards and stacking space is important. The system can satisfy increased printed circuit board density demands and provides reliable "Z" axis interface of multiple printed circuit boards.

The low profile design in accordance with the present invention allows tighter board stacking with 0.05 inch grid density with a minimum printed circuit board to printed circuit board assemblage interface of 0.062 inches. Because the sockets may be manufactured in a continuous format, it is possible to insert these by automatic insertion equipment in any number of pin counts on both standard and special grid spacings.

The progressive or multi-wave socket design eliminates the possibility of spring member overstress and the tapered entry design and contact wiping action minimizes mating force and maximizes the electrical integrity of the interface. Dependable normal forces created by the design produces reliable mating and also establishes very short electrical paths between the interface pin and the printed circuit board.

The printed circuit board contact system of the present invention essentially consists of an integral two piece connected design. This eliminates the need for high cost molded thermoplastic housings and further facilitates printed circuit board assembly as there is no need to be concerned with the packaging of individual piece connecting devices. Because of the excellent printed circuit board fit characteristics achievable with the instant design, dependable electrical integrity of the interface is possible which eliminates the detrimental effects of solder wicking and flux residue contamination as evident with other interconnect systems requiring soldering.

One socket works with a large range of hole diameters. The present design allows 30% change in hole diameters. This makes the fabrication of the multi-layered PC board less expensive because there is no need to hold tight hole tolerances.

The socket also acts as a protective sleeve by protecting the wall of the plated through hole from the damaging combination of high pressure and axial movement which are associated with press fit pins. Other advantages of this system are the very high numbers (several hundred) of mating cycles, thereby rendering the design more reliable and requiring less maintenance or servicing.

The sockets 10 may be supplied on supply reels whereas interface pins may be cassette packaged. Both the socket and the interface pin may be automatically applied by the fully automatic application system model 10000 sold by Zierick Manufacturing Corp., the assignee of the present invention.

While only certain preferred embodiments of this invention have been shown and described by way of illustration, many modifications will occur to those skilled in the art and it is, therefore, desired that it be understood that it is intended herein to cover all such modifications as fall within the true spirit and scope of the invention. Thus, while the sockets 10 and pins 24 have been described as having circular cross-sections along their length, other cross-sectional shapes, such as square, are possible.

I claim:

1. A printed circuit board contact system for providing contact with a conductive sleeve provided on an inner surface of a hole of predetermined substantially uniform cross-sectional dimensions in a printed circuit board, comprising a socket the wall of which is made of a conductive spring sheet material and which defines a longitudinal axis, said socket having broad inlet and narrow outlet ends spaced from each other along said longitudinal axis, said narrow outlet end being dimensioned and configurated in relation to said predetermined dimensions to facilitate insertion thereof into a hole of the printed circuit board and said broad inlet end being dimensioned and configurated in relation to said predetermined dimensions to prevent free passage therethrough when said socket is inserted into the hole; and a conductive pin dimensioned and configurated to be initially receivable with clearance within said broad inlet end, said socket being provided with at least one substantially longitudinal slot generally parallel to said longitudinal axis extending along the length direction of said socket to enable radial expansion of said socket to conform to the outer surface of said pin when said pin is urged through successive portions of said socket along said longitudinal axis in the direction of said narrow end, axially spaced enlarged regions forming outer contact portions which alternate with inner contact portions which define decreasing cross-sectional areas in the direction from said broad to said narrow ends, said socket and pin being dimensioned and configurated to cause said socket to expand when said pin is forced through successively smaller dimensioned areas defined by said inner contact portions to cause proximate outer contact portions to abut against and make electrical contact with the printed circuit conductive sleeve.

2. A contact system as defined in claim 1, wherein said at least one longitudinal slot extends along the entire length of said socket.

3. A contact system as defined in claim 1, wherein one slot is provided.

4. A contact system as defined in claim 1, wherein two slots are provided only one of which extends along the entire length of said socket.

5. A contact system as defined in claim 4, wherein said two slots are on diametrically opposite sides of said longitudinal axis to form at least one pair of associated opposing spring sections radially spaced from each other a distance less than the diameter of said pin.

6. A contact system as defined in claim 4, wherein the hole in the printed circuit board is circular and said socket has an undulating configuration to provide a wave-like shape along the direction of said longitudinal axis to define cross-sections in planes normal to said longitudinal axis which are substantially circular at said outer contact portions and substantially oval at said inner contact portions, said inner and outer contact portions being dimensioned to assure that at least one of said contact portions will be under optimum load when said pin is inserted into said socket.

7. A contact system as defined in claim 6, wherein said pin has a substantially uniform circular cross-section along its length and said inner contact portion most proximate to said broad inlet end defines a diameter greater than said pin diameter to permit said pin to pass therethrough with clearance.

8. A contact system as defined in claim 6, wherein said pin has a substantially uniform circular cross-section along its length, and said inner contact portion most proximate to said narrow outlet end defines a diameter smaller than said pin diameter to require said pin to be forced at least through said narrow outlet end under pressure upon expansion of said narrow outlet end inner contact portion.

9. A contact system as defined in claim 1, wherein said conductive spring sheet material is beryllium copper.

10. A contact system as defined in claim 1, wherein said conductive spring sheet material is fully hard tempered beryllium copper.

11. A contact system as defined in claim 1, further comprising a carrier strip for detachably carrying a plurality of substantially equally spaced funnel shaped sockets, whereby handling and insertion of said sockets into a printed circuit board is facilitated.

12. A contact system as defined in claim 1, in combination with the printed circuit board.

13. A contact system as defined in claim 1, wherein a plurality of printed circuit boards are stacked to produce a stacked module, aligned holes being provided in said stacked boards to form an elongate mounting hole, the inner surface of said elongate mounting hole being provided along its inner surface with a conductive sleeve, said socket having a length substantially equal to the axial length of said elongate mounting hole.

14. A contact system as defined in claim 13, wherein said conductive pin has a length greater than the axial length of said mounting hole.

15. A contact system as defined in claim 13, in combination with the plurality of stacked printed circuit boards.

16. A contact system as defined in claim 13, wherein a plurality of stacked modules are provided spaced from each other, mounting holes on the modules being aligned, and said conductive pins having a length to extend through the aligned holes and bridge the modules to provide electrical contact therebetween.

17. A contact system as defined in claim 16, in combination with the plurality of stacked modules.

18. A contact system as defined in claim 1, wherein said socket is gold plated.

19. A contact system as defined in claim 1, wherein said socket is generally tapered and has decreasing cross-sectional dimensions in the direction from broad inlet end to said narrow outlet end.

20. A contact system as defined in claim 19, wherein at least a portion of said broad inlet end has cross-sectional dimensions greater than those of the hole in the printed circuit board to provide an interference fit when said socket is inserted into the hole.

21. A contact system as defined in claim 20, wherein said wall of said socket is substantially of uniform thickness with the exception of at least said portion of said broad inlet end which has a wall thickness which decreases in the direction away from said narrow outlet end.

22. A contact system as defined in claim 1, wherein said broad inlet end is funnel-shaped and said slot extending through said broad inlet end is v-shaped and has the minimum width in the region where said broad inlet end meets an intermediate body portion of said socket between said ends thereof.

* * * * *